United States Patent [19]

Zukotynski et al.

[11] Patent Number: 5,039,376
[45] Date of Patent: Aug. 13, 1991

[54] METHOD AND APPARATUS FOR THE PLASMA ETCHING, SUBSTRATE CLEANING, OR DEPOSITION OF MATERIALS BY D.C. GLOW DISCHARGE

[76] Inventors: Stefan Zukotynski, 32 Maryvale Cresc., Richmond Hill, Ontario, Canada, L4C 6P8; Romon V. Kruzelecky, 352 Brigadoon Dr., Hamilton, Ontario, Canada, L9C 6X4; Franco Gaspari, 142 Abbeywood Dr., Don Mills, Ontario, Canada, M3B 3B7; Clement I. Ukah, 30 Charles St., W. #1623, Toronto, Ontario, Canada, M4Y 1R5

[21] Appl. No.: 565,831

[22] Filed: Aug. 13, 1990

Related U.S. Application Data

[63] Continuation-in-part of Ser. No. 228,414, Aug. 5, 1988, abandoned.

[51] Int. Cl.$^5$ .............................................. H01L 21/00
[52] U.S. Cl. ..................................... 156/643; 156/345; 118/723; 427/39; 204/192.32; 204/298.06; 204/298.14; 204/298.31; 204/298.33; 204/298.34; 204/298.39
[58] Field of Search ...................... 156/345, 643; 204/298.33, 298.34, 298.39, 192.27, 298.06, 298.14, 298.31, 192.32; 118/723, 725; 427/39

[56] References Cited

U.S. PATENT DOCUMENTS

| | | | |
|---|---|---|---|
| 4,070,264 | 1/1978 | Loiseau et al. | 204/298.31 |
| 4,223,048 | 9/1980 | Engle, Jr. | 118/723 |
| 4,289,598 | 9/1981 | Engle, Jr. | 156/437 |
| 4,492,716 | 1/1985 | Yamazaki | 437/225 |
| 4,633,809 | 1/1987 | Hirose et al. | 118/723 |
| 4,633,811 | 1/1987 | Maruyama | 118/723 |
| 4,643,952 | 2/1987 | Kurakata | 204/192.31 |
| 4,676,195 | 6/1987 | Yasui et al. | 118/723 |
| 4,735,633 | 4/1988 | Chiu | 118/723 |
| 4,950,376 | 8/1990 | Hayashi et al. | 204/192.32 |

FOREIGN PATENT DOCUMENTS

| | | | |
|---|---|---|---|
| 52-20294 | 2/1977 | Japan | 204/192.31 |
| 59-14633 | 1/1984 | Japan . | |

Primary Examiner—Richard Bueker
Assistant Examiner—George Goudreau
Attorney, Agent, or Firm—Rogers & Scott

[57] ABSTRACT

The invention provides new methods and apparatus for the deposition of materials on substrates by the use of a D.C. glow discharge, sometimes also called a plasma discharge. A precursor gas (or gases) is introduced at low pressure (10-500 milliTor) into an enclosure containing two spaced parallel cathode electrodes and an intermediate parallel anode electrode, preferably midway between the two cathodes, which anode electrode is permeable to at least electrons of the glow or plasma discharge. Upon application of a suitable positive potential to the anode a deposition plasma is generated in the space on both sides of the anode. The plasma of charged and neutral radicals moves to the cathodes both by charge attraction and by diffusion, facilitated by gas flow toward the cathodes, giving high quality films at increased deposition rates, higher possible discharge current densities, lower gas pressures with consequent gas economy and safety, improved film adhesion, and greater independence of these parameters from one another than has been possible with the prior art processes. To avoid encroachment of the plasma on the cathodes and substrates supplementary ion permeable cathode electrodes may be interposed between the first-mentioned cathodes and the anode close to the former.

24 Claims, 5 Drawing Sheets

METHOD AND APPARATUS FOR THE PLASMA ETCHING, SUBSTRATE CLEANING, OR DEPOSITION OF MATERIALS BY D.C. GLOW DISCHARGE

CROSS-REFERENCE TO RELATED APPLICATION

This application is a continuation-in-part of our earlier application No. 07/228,414, filed 5 Aug. 1988, now abandoned.

FIELD OF THE INVENTION

The present invention is concerned with new methods and apparatus for the plasma etching, substrate cleaning or deposition of materials by D.C. glow discharge.

REVIEW OF THE PRIOR ART

The deposition of materials on substrates to form thin films of the material thereon is a well established industrially important art. The processes of plasma etching and substrate cleaning will be described below. Such deposition processes in which precursor gases are decomposed to give condensable depositable radicals have been referred to generally since their first introduction as "glow discharge deposition" processes, but are now also referred to as "plasma deposition" processes. A large number of different materials can be deposited in this manner such as silicon, carbon, phosphorus, boron and arsenic, either alone or in combination, dependent only upon the availability of suitable precursor gases. This art became very important in the development and fabrication of semiconductor devices based upon amorphous silicon upon the discovery of the beneficial effects of controlled hydrogenation thereof by deposition in the presence of hydrogen, and it is now possible to deposit amorphous silicon films with extremely small electrically active defect densities, and with electrical properties that can be controlled by substitutional doping. The hydrogenated, doped amorphous silicon layer acts as an extrinsic semiconductor and is now used in relatively large scale devices (i.e. much larger than the silicon "chip" typically employed in micro-electronics) such as photovaltaic cells and xerographic type photocopiers.

There are two principal glow discharge deposition systems currently in use, namely D.C. excited and R.F. excited. In D.C. discharge processes a D.C. field is produced in an evacuated chamber between two (usually parallel) electrodes, and the substrate to receive the deposited materials is generally mounted on the cathode, or forms the cathode. The precursor gas (or gases) is supplied to the chamber at pressures that are relatively high for these discharge processes, typically 100–500 milliTorr, and dissociation of the molecules takes place by excitation and ionization and electron impact, including impact of secondary electrons produced by impact with the cathode of ions that have been produced by the excitation, resulting in a plasma containing a wide variety of ionic species. As reported in "Plasma Deposited Thin Films", edited by MORT, Joe and JANSEN, Frank, published 1986 by CRC Press Inc., Boca Raton, Flor., since molecular dissociation energies are usually significantly smaller than atomic or molecular ionization energies the density of neutral dissociation radicals in the plasma is much greater than that of the ionic radicals, and it is the electrically neutral species that contribute predominantly to the film growth. These neutral radicals must find their way to the surface of the growing film primarily by diffusion, and consequently the processes are slow and not very efficient, with the material depositing also on the anode and the internal surfaces of the enclosure. Also, a considerable proportion is removed with the flow of the precursor gas necessary to replenish the deposited material while maintaining the pressure at a sufficiently high value. The deposition process takes place mainly at the cathode although, because of the nature of the plasma, considerable deposition also occurs at the anode.

In R.F. deposition processes the plasma is produced by high frequency excitation (usually at the officially designated frequency of 13.56 MHz), the energy being applied to the interior of the container enclosing the substrate and the precursor gas either by means of two internal electrodes directly capacitively coupled to the R.F. source, or by means of external electrodes or a coil. The external electrode geometry is primarily restricted to tubular reactor shapes of small diameter and internal electrode systems are usually preferred. The ionization processes involved take place in the bulk of the plasma, the electrons oscillating in the high frequency field and picking up enough energy to fragment, excite and ionize the gas molecules. Because of the high frequency the relatively heavy ions are not displaced significantly by it, and can be regarded as immobile, and again therefore it is diffusion and drift of the radicals that contributes predominantly to the growth of the deposited film. In operation, due to loss of electrons therefrom the plasma assumes a net positive charge, resulting in D.C. potentials that affect the deposition. R.F. systems are inherently more difficult to control, owing to the need to maintain the coupling of the electrode structure to the power source in the face of progressively changing characteristics of the electrode structure as the semiconductive film builds up on the substrate, and as material deposits also on the electrodes.

It is of course the principal objective with all of these processes to obtain uniform deposition of adherent films of predetermined characteristics over as large an area as possible, and this is primarily dependent upon the relative ease by which high, uniform electric fields can be created over correspondingly large areas with these internal electrodes. Other problems encountered are that if the energy applied is insufficient the process is correspondingly slow and the adhesion of the resultant films is also usually found to be poor. On the other hand if the field strength is increased to speed up the process there is the danger of damage, usually referred to as "etching", caused by excessive ion bombardment of the film, resulting in structural damage by the generation of nucleation sites, or by heating to result in polycrystalline material instead of the desired amorphous structure, and/or resulting in the production of unsaturated bonds which are electronically active and undesirable. The mean free path of the exciting electrons in the gas is an important parameter and is dependent upon the gas pressure in the enclosure; a low gas pressure slows the rate of deposition and can also result in excessive ion bombardment, while too high a pressure results in an inadequate mean free path and recombination reactions between the radicals. With both systems the field strength and gas pressure are highly interdependent making the choice of the optimum parameters for operation very difficult. Despite the greater operating difficulties encountered with R.F. systems they generally are able to produce more uniform films, and are at present preferred in industry.

The mean free path of electrons between ionizing collisions becomes comparable to the typical vacuum chamber dimensions at pressures below 100 mTorr, and consequently it becomes increasingly more difficult to maintain a stable discharge as the pressure is decreased to be in this range. It is well known that the ionization path length for electrons can be increased by the application of a magnetic field which forces electrons to gyrate in their travel from the cathode to the anode. However the use of permanent magnets or electromagnetic coils places severe restrictions on the physical dimensions of the vacuum chamber. It is also known that the ionization path length of electrons can be increased by using an electrostatic field which forces electrons to oscillate through a transparent anode region located between two cathodes, and such an arrangement for the production of atom beams is described, for example, in the paper "Atom Beam Sources" by J. Franks published in Vacuum, volume 34, pages 259 to 261 (1984).

A plasma generator is disclosed in French Patent No. 86-04725 (Publication No. 2,596,580) of Jaques Menet et al, assigned to Centre National de la Reserche Scientifique, laid open to public inspection Oct. 2nd, 1987. In its embodiment as a plasma generator an enclosure made of electrically conducting material and containing a low pressure gas corresponding to the ions to be generated is held at an electric potential $V_1$. Inside the enclosure is an anode electrode held at an electric potential $V_2$ higher than $V_1$, the electrode being permeable (i.e.-transparent) in that it allows an equipotential surface to be established while still allowing the passage of particles such as electrons or ions. An electron attracted to the permeable (i.e.-transparent) electrode oscillates from one side to the other thereof by repeated attraction, any collision with an atom or molecule of the gas producing a positive ion that is attracted to the enclosure wall (acting as a cathode) and a second electron, such multiplication continuing until limited by the incomplete permeability (i.e.-transparency) of the electrode, the loss of ions to the enclosure wall, collisions between ions and electrons, and by other parasitic phenomena, the discharge established in the gas being self-sustaining and stable as long as the potential difference $V_2 - V_1$ is sufficient.

DEFINITION OF THE INVENTION

It is a principal object of the present invention to provide new methods for the plasma etching, substrate cleaning, or deposition of materials by D.C. glow or plasma discharge.

It is another principal object to provide new apparatus for operation of such methods.

In accordance with the present invention there is provided a new method for the plasma etching, substrate cleaning, or deposition of materials on a substrate by D.C. glow or plasma discharge comprising the steps of:

providing an enclosure having a gas inlet to its interior and a gas outlet therefrom and having in its interior two spaced cathode electrodes establishing a plasma containing zone between them, and also having in its interior an intermediate anode electrode disposed in the said plasma-containing zone, the anode electrode being permeable (i.e.-transparent or translucent) to at least electrons of the glow or plasma discharge;

at least one of the cathode electrodes constituting the said substrate or having the substrate attachable thereto;

supplying to the enclosure interior at least one precursor gas electrically decomposable to provide radicals of the required material; and providing between the anode electrode and the two cathode electrodes respective operating voltages such as to establish respective electric fields of strength sufficient to produce glow discharge decomposition of the precursor gas and production of a corresponding plasma in the said zone.

Also in accordance with the invention there is provided new apparatus for the plasma etching, substrate cleaning, or deposition of materials on a substrate by D.C. glow or plasma discharge comprising:

an enclosure having a gas inlet to its interior and a gas outlet therefrom and having in its interior two spaced cathode electrodes establishing a plasma containing zone between them, and also having in its interior an intermediate anode electrode disposed in the said plasma-containing zone, the anode electrode being permeable (i.e.-transparent or translucent) to at least electrons of the glow or plasma discharge;

at least one of the cathode electrodes constituting the said substrate or having the substrate attachable thereto;

means for supplying to the gas inlet at least one precursor gas electrically decomposable to provide radicals of the required material; and means for providing between the anode electrode and the two cathode electrodes respective operating voltages such as to establish respective electric fields of strength sufficient to produce glow discharge decomposition of the precursor gas and production of a corresponding plasma in the said zone.

DESCRIPTION OF THE DRAWINGS

Methods and apparatus which are particular preferred embodiments of the invention will now be described, by way of example, with reference to the accompanying drawings, wherein.

DESCRIPTION OF THE PREFERRED EMBODIMENTS

Figure 1:
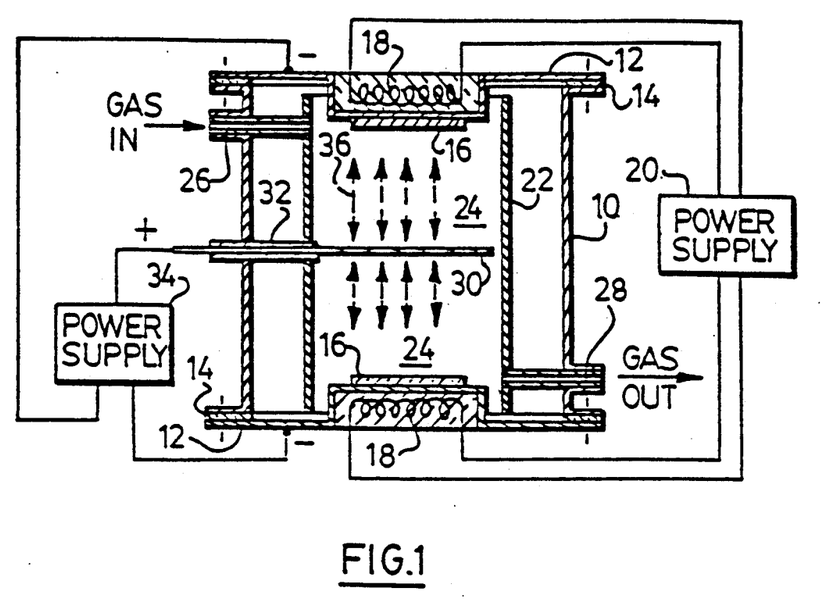
FIGS. 1 through 4 are respective schematic and longitudinal diagrammatic cross-sections of first, second, third and fourth embodiments.

The invention will be described initially in its application to methods of deposition of suitable materials, and its application to plasma etching and substrate cleaning will be described below. Referring now to FIG. 1, a deposition chamber as employed for relatively small substrates consists of an open-ended outer metal cylinder 10 provided with removable end covers 12, each of which in this embodiment also constitutes one of a pair of parallel cathode electrodes. The covers can be clamped tightly in place by any suitable means which are not illustrated, and in this embodiment have electrically insulating gaskets 14 sandwiched between them and the cylinder 10 for a purpose explained below. In this embodiment the cathode end plates do not themselves constitute the substrate for deposition, and accordingly at least one of them has a substrate element 16 mounted on its inside surface; in this embodiment both of the end plates are provided with such substrates. The central portions of the end plates receiving the substrates are depressed inwardly towards one another so that they are more closely spaced than the remainder of the plates. The resultant recesses at the outer surfaces are provided with respective electric heaters 18 supplied from a power source 20 to maintain the substrates at a temperature suitable for deposition (usually about 200°–400° C. in the case of amorphous hydrogenated silicon). A second open-ended replaceable cylinder 22 of any suitable material is mounted coaxially within the outer cylinder 10 to more closely define a plasma-containing zone 24 between the two more-closely spaced portions of the two cathodes; in use the interior surface of this cylinder also becomes coated with deposited material and can be replaced when the deposit becomes too thick, reducing very considerably the deposition on the inner wall of the outer cylinder 10 and the need to clean or replace it.

The precursor gas or gases are introduced into the interior of the enclosure via an inlet 26 and the depleted gas or gases removed therefrom via an outlet 28. The procedures and apparatus for the safe supply and control of these gases, many of which are pyrophoric or highly toxic, are well documented in the art and need not be detailed in this application.

An anode electrode 30, which in this embodiment has the form of a flat wire open grid, is mounted in the interiors of the two cylinders 10 and 22 by means of an electrically insulating structure 32 passing through the cylinder walls so as to be parallel to the two parallel cathodes 12. A stabilized D.C. power supply 34 is connected to the anode 30 and the two cathodes 12 to apply suitable constant potential differences between them, and produce a corresponding electric field in the zone 24, which we refer to colloquially as a "saddle" field owing to its characteristic profile between the two cathodes.

The production of thin films using the processes and apparatus of the invention shows that such glow discharge or plasma formation can be made to take place over a much wider range of gas pressures and at higher current densities than has been possible using prior art D.C. systems. It is believed that these improved results follow from the fact that this particular electrode configuration causes the available electrons to oscillate in the central zone 24, as indicated by the broken arrows 36, the energetic electrons passing freely through the electrode 30 which is permeable (i.e.-transparent or at least translucent) to them, these electrons continuing to promote ionization rather than being collected by the anode, resulting in an ionization that is relatively insensitive to geometry and gas pressure. This saddle field configuration promotes ionization of the gas close to the anode electrode, while the oscillating trajectory of the electrons increases the effective path length for ionizing collisions, facilitating the formation of high current discharges at relatively low pressures. The saddle field also causes positively ionized radicals to be accelerated towards the cathode electrodes, and a greater number of charged radicals are produced, so that the speed of deposition is greater and is not so dependent as the prior art D.C. process on the diffusion and drift of radicals; there is therefore much more efficient utilization of the precursor gas.

Since the methods and apparatus of the invention are D.C. operated the sensitive tuning of the prior art R.F. apparatus is not required. If both cathodes are employed as substrate supports then the anode 30 preferably is centrally disposed and the respective portions of the saddle field are symmetrical about the anode. The flow of the precursor gas from the inlet 26 to the outlet 28 will substantially increase the quantity of the ions that move toward the cathode 12 downstream of the flow, as compared to the corresponding quantity of those moving upstream toward the other cathode adjacent the gas inlet, resulting in some asymmetry in the rates of deposition on the respective substrates, and an embodiment employing this flow enhancing effect to facilitate deposition or both cathodes is described below. If only one substrate is provided then the field need not be symmetric, but instead can be asymmetric with the stronger portion toward the substrate supporting cathode, the asymmetry being produced either mechanically by placing the anode closer to the respective cathode, or electrically by increasing the potential difference between the two electrodes. The two cathodes 12 are insulated from the enclosure 10 and from one another by the gaskets 14 to permit this electrically-produced asymmetry.

Figure 2:
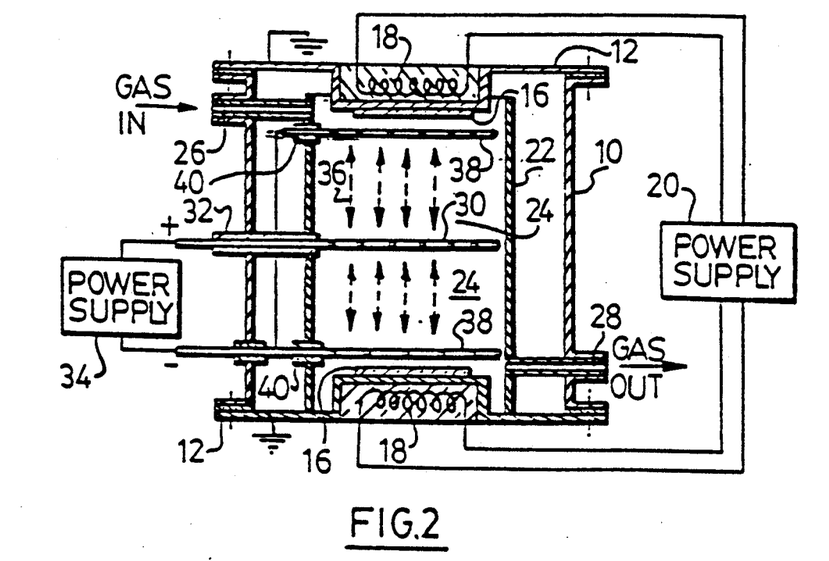

It is undesirable for the plasma containing zone 24 to extend so far as to include the substrate since the ionized radicals then impinge on the growing film with substantial velocities and may damage it, as described above. This can be avoided while employing relatively high fields by the embodiment of FIG. 2, in which two subsidiary ion permeable flat open grid cathode electrodes 38 are disposed close and parallel to the respective end plate cathode electrodes 12 and their respective substrates 16. The negative potentials are applied to these subsidiary cathode electrodes which are both next adjacent to the anode electrode and the two first cathode electrodes 12 are grounded, and may be at zero, or at a small negative or positive potential relative to the subsidiary cathode electrodes 38. The plasma is now confined to the zone between the two subsidiary electrodes, which since they are permeable to both the charged and neutral radicals, permit them to pass relatively freely therethrough to the substrate with the rate of impact of the radicals on the substrate being controllable by choice of the value and size of the potential difference between the first and subsidiary electrodes. For example, a small positive potential on each end plate electrode 12 will result in a decelerating field between each subsidiary electrode 38 and its respective end plate electrode, reducing the impact of the ions on the associated substrate. The two subsidiary electrodes are mounted on the cylinder 22 by respective electrically insulating structures 40 so that their potentials can be adjusted individually; in the embodiment illustrated they are strapped together to be at the same potential.

Figure 3:
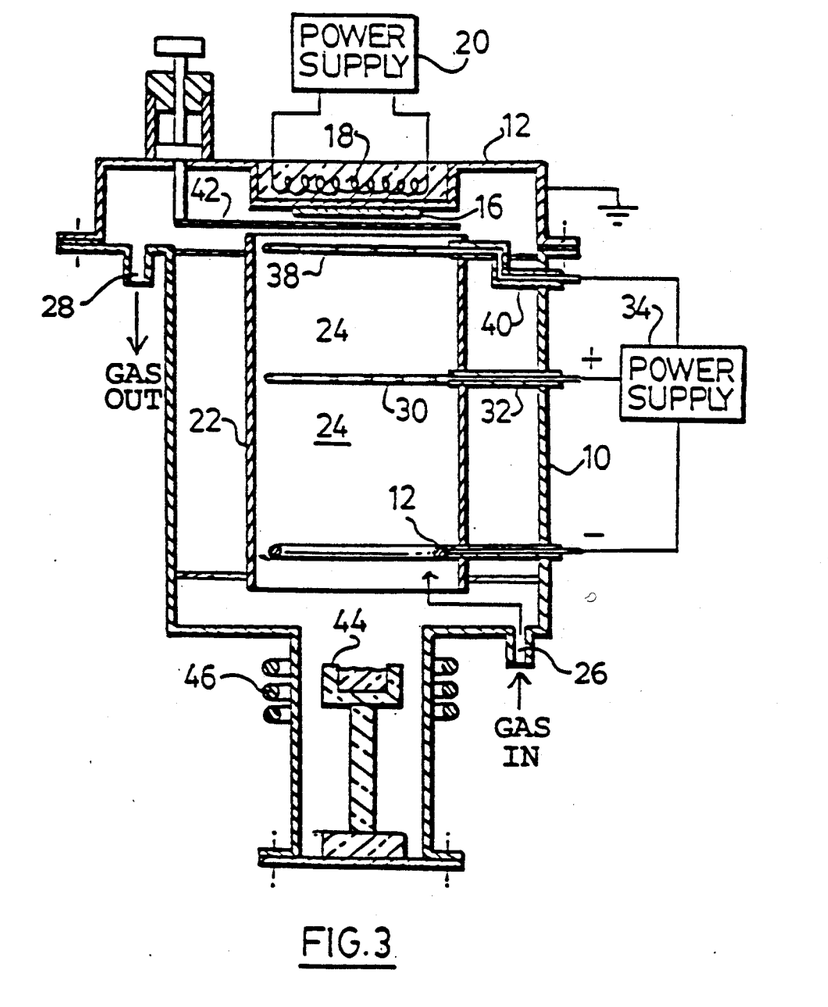

FIG. 3 is an example of another apparatus characterized in that only a single substrate 16 is provided mounted on the respective first end plate cathode electrode 12. A movable shutter 42 is provided between this first cathode electrode 12 and the associated subsidiary electrode 38 to permit the substrate to be screened for selective deposition of the material thereon. The flow of the precursor gas is from the anode 30 to the upper cathode 12 carrying the substrate to facilitate the flow of ions in that direction. The other first cathode electrode 12 is not associated with a substrate and does not therefore require a subsidiary cathode 38; the electrode is of ring formation to permit the free passage or radicals therethrough. A removable crucible 44, the contents of which are heated by an induction heater 46, is provided to permit coevaporation of the material in the crucible during the deposition.

Figure 4:
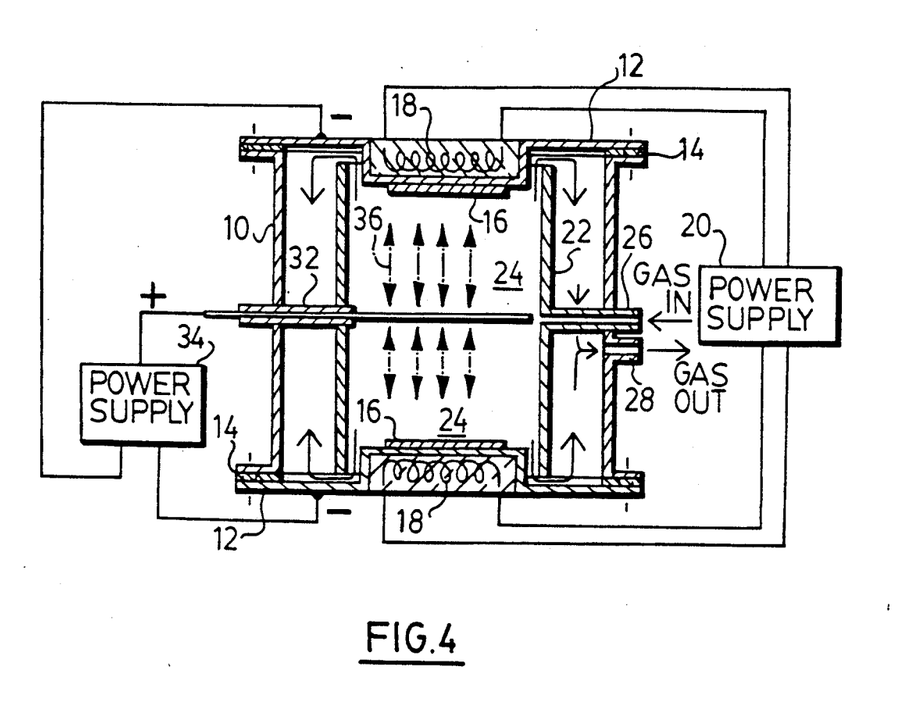

In the fourth embodiment of FIG. 4 a single gas inlet 26 is arranged to discharge the gas into the interior of the replaceable cylinder 22 adjacent the anode electrode 30, while the gas outlet 28 is disposed to communicate with the space between the cylinders 10 and 22 adjacent the gas inlet. The gas therefore flows substantially equally in opposite directions from the inlet towards both of the cathodes 12, thereby promoting movement of the ions generated in the neighbourhood of the anode approximately equally oppositely towards the two cathodes to provide correspondingly approximately equal rates of deposition thereon.

As described above, one of the most commercially interesting processes involving plasma deposition is the direct formation of thin films of hydrogenated amorphous silicon, and the methods and apparatus of the invention have been used very successfully in the production of such films. As is usual these films have been produced by the dissociation of silane gas ($SiH_4$), and it has been found possible to operate effectively with gas pressures as low as 10 milliTorr, as compared to about 100 milliTorr found to be the minimum with conventional D.C. methods. Relatively high growth rates of about 5–10 Angstroms/sec. were obtained, as compared with about 2–3 Angstroms/sec. with the prior art. The hydrogen incorporation was controlled by coevaporation of silicon, and films were obtained exhibiting high photoconductive gain exceeding $10^4$ under Air Mass 1 illumination with a wide range of hydrogen content from about 5 to about 25 atomic percent. The films obtained exhibited good adhesion and activated conduction over a wide temperature range from about 200° K. to about 450° K.

Figure 5:
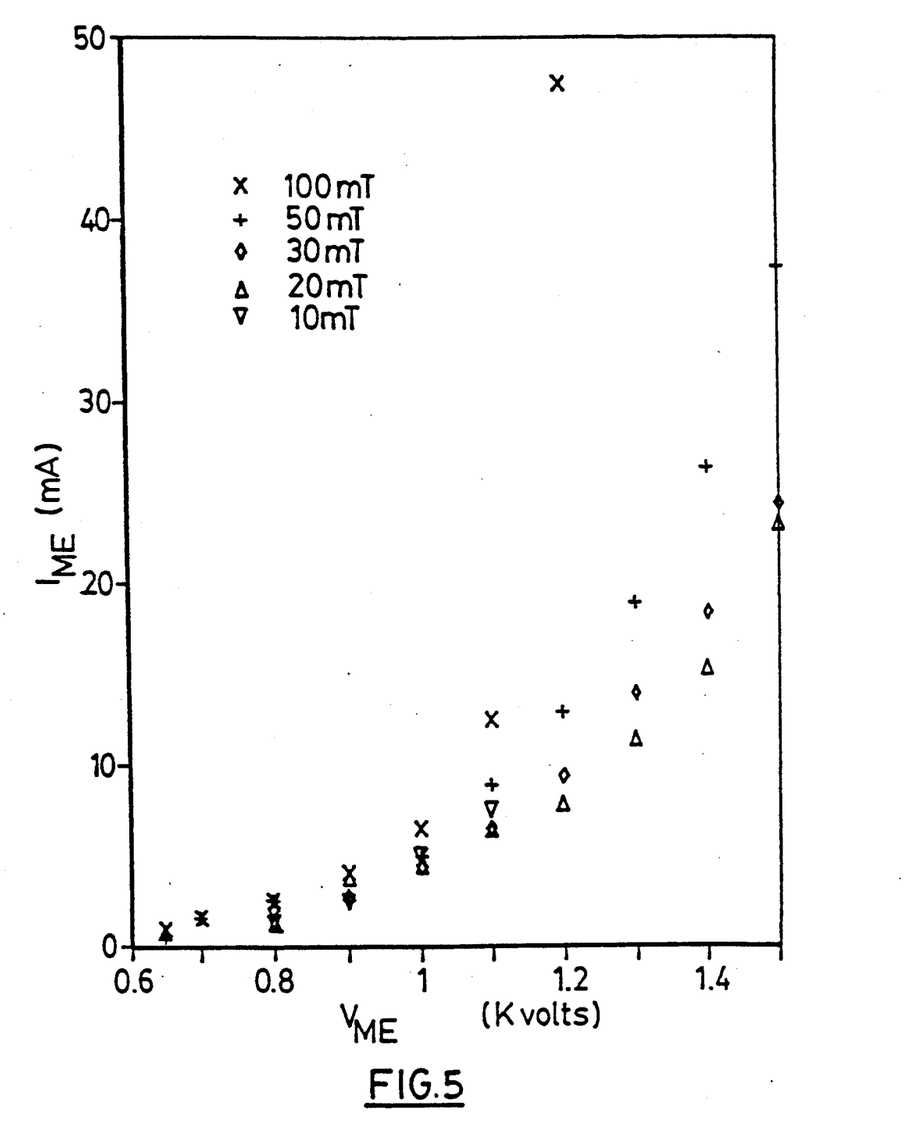
FIG. 5 is a graph of the current flow at different gas pressures through an intermediate anode electrode with the voltage applied between that electrode and a cathode electrode.

FIG. 5 is a graph showing with the production of such silicon films the current flow through the anode electrode 22 with the voltage applied between the anode and the cathodes at different silane gas pressures. The individual test result values are plotted and are not connected since they converge so much in the range 600–1000 volts as to possibly be confusing. This shows that the results obtained at the low pressure of 10 milliTorr were strictly comparable with those obtained at the higher pressures; the highest pressure usable with this apparatus was below 500 milliTorr, since at this pressure an apparent arc-type discharge was established to give excessively high current flow and the consequent high possibility of deleterious etching. The most important characteristic established by these test results is the relative independence of potential applied (and hence field strength) and the gas pressure that could be used, permitting a much wider range of individual adjustment of these different parameters than has been possible hitherto. It may be noted that this was a laboratory-type apparatus employing electrodes of about 13 cm diameter and about 4–6.5 cm spacing between each cathode and the anode. As is indicated by the graph, voltages of up to about 1500 volts can be employed to give field gradients of about 300 volts per cm., although the more usual value for silane is about 800 volts, or about 160 volts per cm. With alternative structures it is possible to operate the processes of the invention with gas pressures of about 10 to about 300 milliTorr, preferably in the range 30–50 milliTorr, with an absolute maximum at 500 milliTorr. These lower pressures have the advantage of considerable economy in the use of the expensive precursor gases, which is of course of particular commercial interest. They also result in increases in safety and in the handling and disposal of the gases. The application of the invention also permits higher discharge current densities produced by the application of higher fields between the electrodes. For example, in the prior art it has been customary to operate with discharge current densities of from about 10 to about 50 microamperes per cm. sq., corresponding to fields of about 150 to about 350 volts per cm. With the methods and apparatus of the invention it is possible to operate with current densities in the range of about 10 and 500 microamperes per cm. sq., and with corresponding field strengths in the range of about 100 to 300 volts per cm.

Figure 6:
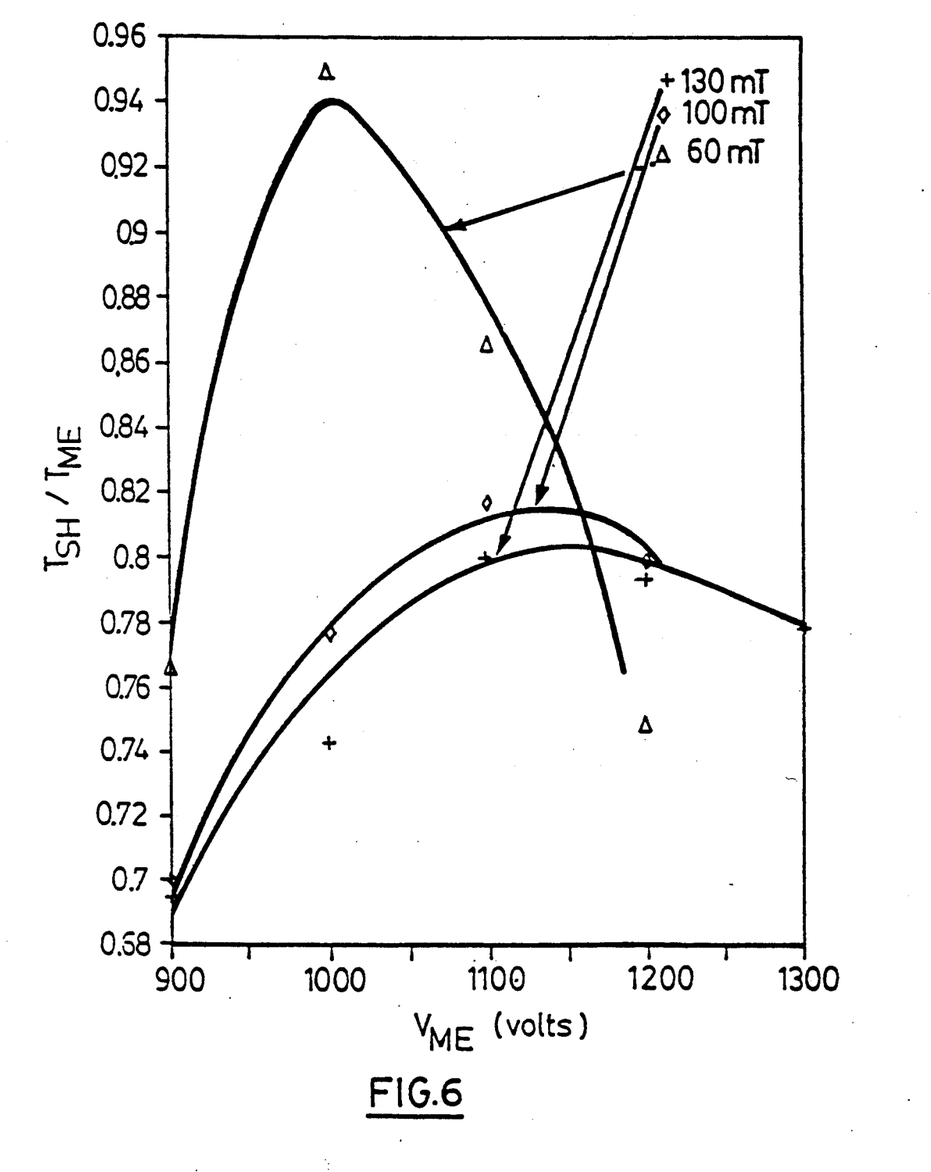
FIG. 6 is a graph of the ratio $I_{SH}/I_{ME}$ of the current flows, also at different gas pressures, through a supplementary cathode electrode ($I_{SH}$) and the intermediate anode electrode ($I_{ME}$) with the voltage as in FIG. 4.

FIG. 6 is a graph, again produced in the formation of thin amorphous silicon films from silane, showing the ratio of the currents obtained at the subsidiary cathode electrodes 38 ($I_{SH}$) and at the middle anode electrode 22 ($I_{ME}$) with the voltage applied to the electrode 22 ($V_{ME}$) at various gas pressures. All three plots obtained show a peak in these ratios at a voltage that increases with increasing pressure and show that high deposition efficiencies are available at the low discharge pressures and low voltages made possible by the present invention.

The description of the invention has been in general terms since it is applicable to a wide range of deposition materials, even though specific examples have been given only for the production of amorphous silicon layers employing silane. Examples of other processes are plasma etching, substrate cleaning and the deposition of carbon, germanium and silicon nitride. Plasma etching is a chemical-type process in which surface atoms are removed by reaction with the active radicals of the plasma; it is useful for example in producing grooves in integrated circuit design. Substrate cleaning is a mechanical-type process employed to remove unwanted surface atoms by transferring kinetic energy of the plasma radicals to these atoms. Reference may also be made to the text book referred to above, the disclosure of which is incorporated herein by this reference.

The drawings show the apparatus in a particular attitude, but the processes employed are of course not attitude-dependent and the apparatus can be employed in any other appropriate attitude and configuration. The electrode 30 and the permeable electrodes 38 are described and illustrated herein as open grids; in the laboratory-type apparatus employed such a grid is for example of thin wires of 0.3 mm diameter spaced approximately 1–2 cm apart, and are adequate to apply the required field while being translucent, i.e. sufficiently permeable (i.e.-transparent), to the plasma electrons. A plain open ring electrode can also be used provided the resultant non-uniformity of the field can be tolerated. In either laboratory or commercial practice it will usually be difficult and inconvenient to make the apparatus as illustrated sufficiently gas-tight to operate readily at the low operating pressures involved, and it will therefore usually be completely enclosed in an evacuable chamber whose structure and arrangement does not constitute part of the present invention. Appropriate structures will be readily apparent to those skilled in this particular art, and therefore need not be specifically described and illustrated herein.

We claim:

1. A method for the plasma etching, substrate cleaning or deposition of materials on a substrate by D.C. glow or plasma discharge comprising:

providing an enclosure having a gas inlet to its interior for precursor gas ionizable by the D.C. glow or plasma discharge to provide radicals of material that will perform the said plasma etching, substrate cleaning or material deposition, and having a gas outlet therefrom, the enclosure having in its interior;

an anode electrode permeable to electrons;

two spaced first cathode electrodes on either side of the anode, at least one of these first cathode electrodes constituting the said substrate or having the substrate attachable thereto; and at least one supplementary cathode electrode, each of which is permeable to ions, each supplementary cathode electrode being disposed between the anode electrode and a respective one of the first cathode electrodes and close to the respective first cathode electrode;

the two cathode electrodes on opposite sides of the anode electrode and next adjacent to the anode electrode establishing a plasma containing zone between them, supplying at least one precursor gas to the enclosure interior; and providing between the two cathode electrodes and the anode electrode respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding glow or plasma discharge that is a source of radicals moving to the substrate to perform the said plasma etching, substrate cleaning or material disposition.

2. A method as claimed in claim 1, including supplying another material for deposition to the enclosure interior by coevaporation thereof within the enclosure interior.

3. A method as claimed in claim 1, wherein the said operating voltage provided between the anode electrode and at least one supplementary cathode electrode cooperating with a first cathode electrode that constitutes a substrate or has a substrate attachable thereto is such as to produce a current density in the range of about 10 to 500 microamperes per cm.sq.

4. A method as claimed in claim 1, wherein the gas inlet and the gas outlet are disposed to produce flow of the precursor gas from the anode electrode toward at least one of the first electrodes that constitutes a substrate or has a substrate attachable thereto to facilitate movement of radicals produced by the glow or plasma discharge toward the respective substrate.

5. A method for the plasma etching, substrate cleaning or deposition of materials on a substrate by D.C. glow or plasma discharge comprising:

providing an enclosure having a gas inlet to its interior and a gas outlet therefrom;

the enclosure having in its interior at least one cathode electrode constituting the said substrate or having the substrate attachable thereto and at least one other cathode electrode, the enclosure having therein two spaced cathode electrodes establishing a plasma containing zone between them with an intermediate anode electrode disposed in the said plasma-containing zone between the two cathode electrodes establishing the plasma containing zone, the anode electrode being permeable to electrons; and;

supplying to the enclosure interior at least one precursor gas ionizable by the D.C. glow or plasma discharge to provide radicals of material that will perform the said plasma etching, substrate cleaning or material deposition;

providing between the two cathode electrodes establishing the plasma containing zone and the anode electrode respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding glow or plasma discharge that is a source of radicals moving to the substrate to perform the said plasma etching, substrate cleaning or material disposition; and supplying another material for deposition to the enclosure interior by coevaporation thereof within the enclosure interior.

6. A method as claimed in claim 5, wherein the said operating voltage provided between the anode electrode and at least one of the two cathode electrodes establishing the plasma containing zone is such as to produce a current density in the range of about 10 to 500 microamperes per cm.sq.

7. A method as claimed in claim 5, wherein the gas inlet and the gas outlet are disposed to produce flow of the precursor gas from the anode electrode toward the said at least one electrode that constitutes a substrate or has a substrate attachable thereto to facilitate movement of radicals produced by the glow or plasma discharge toward the respective substrate.

8. A method for the plasma etching, substrate cleaning or deposition of materials on a substrate by D.C. glow or plasma discharge comprising:

providing an enclosure having a gas inlet to its interior and a gas outlet therefrom;

the enclosure having in its interior at least one cathode electrode constituting the said substrate or having the substrate attachable thereto and at least one other cathode electrode, the enclosure having therein two spaced cathode electrodes establishing a plasma containing zone between them with an intermediate anode electrode disposed in the said plasma-containing zone between the two cathode electrodes establishing the plasma containing zone, the anode electrode being permeable to electrons;

supplying to the enclosure interior at least one precursor gas ionizable by the D.C. glow or plasma discharge to provide radicals of material that will perform the said plasma etching, substrate cleaning or material deposition, the gas inlet being disposed to deliver the precursor gas into the enclosure interior at least adjacent to the anode electrode and the gas inlet and the gas outlet being disposed relative to one another to produce flow of the precursor gas from the anode electrode toward the said at least one electrode that constitutes a substrate or has a substrate attachable thereto to facilitate movement of radicals produced by the glow or plasma discharge toward the respective substrate; and providing between the two cathode electrodes establishing the plasma containing zone and the anode electrode respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding glow or plasma discharge that is a source of radicals moving to the substrate to perform the said plasma etching, substrate cleaning or material disposition.

9. A method as claimed in claim 8, wherein the said operating voltage provided between the anode electrode and at least one of the two cathode electrodes establishing the plasma containing zone is such as to produce a current density in the range of about 10 to 500 microamperes per cm.sq.

10. Apparatus for the plasma etching, substrate cleaning or deposition of materials on a substrate by D.C. glow or plasma discharge comprising:

an enclosure having a gas inlet to its interior for precursor gas ionizable by the D.C. glow or plasma discharge to provide radicals of material that will perform the said plasma etching, substrate cleaning or material deposition, and having a gas outlet therefrom, the enclosure having in its interior;

an anode electrode permeable to electrons;

two spaced firs cathode electrodes on either side of the anode, at least one of these first cathode electrodes constituting the said substrate or having the substrate attachable thereto; and at least one supplementary cathode electrode, each of which is permeable to ions, each supplementary cathode electrode being disposed between the anode electrode and a respective one of the first cathode electrodes and close to the respective first cathode electrode;

the two cathode electrodes on opposite sides of the anode electrode and next adjacent to the anode electrode establishing a plasma containing zone between them, means for supplying at least one precursor gas to the enclosure interior; and means for providing between the two cathode electrodes and the anode electrode respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding gow or plasma discharge that is a source of radicals moving to the substrate to perform the said plasma etching, substrate cleaning or material disposition.

11. Apparatus as claimed in claim 10, including means for supplying another material for deposition to the enclosure interior by coevaporation thereof within the enclosure interior.

12. Apparatus as claimed in claim 10, wherein the said operating voltage provided between the anode electrode and at least one supplementary cathode electrode cooperating with a first cathode electrode that constitutes a substrate or has a substrate attachable thereto is such as to produce a current density in the range of about 10 to 500 microamperes per cm.sq.

13. Apparatus as claimed in claim 10, wherein the gas inlet and the gas outlet are disposed to produce flow of the precursor gas from the anode electrode toward at least one of the first electrodes that constitutes a substrate or has a substrate attachable thereto to facilitate movement of radicals produced by the glow or plasma discharge toward the respective substrate.

14. Apparatus as claimed in claim 10, and including a plasma-containing shield wall within the said enclosure extending between the two cathode electrodes that establish the plasma-containing zone and surrounding the anode electrode to receive deposited material and inhibit its deposition on the interior wall of the said enclosure.

15. Apparatus as claimed in claim 10, and including in the enclosure a movable shutter, the apparatus also including means for moving the shutter between a position in which it is interposed between the anode and a respective substrate to intercept radicals and provide selective access of the radicals to that substrate, and a position in which it is not so interposed and the radicals have free access to the substrate.

16. Apparatus for the plasma etching, substrate cleaning or deposition of materials on a substrate by D.C. glow or plasma discharge comprising:

an enclosure having a gas inlet to its interior and a gas outlet therefrom;

the enclosure having in its interior at least one cathode electrode constituting the said substrate or having the substrate attachable thereto and at least one other cathode electrode, the enclosure having therein two spaced cathode electrodes establishing a plasma containing zone between them with an intermediate anode electrode disposed in the said plasma-containing zone between the two cathode electrodes establishing the plasma containing zone, the anode electrode being permeable to electrons;

means for supplying to the enclosure interior at least one precursor gas ionizable by the D.C. glow or plasma discharge to provide radicals of material that will perform the said plasma etching, substrate cleaning or material deposition;

means for providing between the two cathode electrodes establishing the plasma containing zone and the anode electrode respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding glow or plasma discharge that is a source of radicals moving to the substrate to perform the said plasma etching, substrate cleaning or material disposition; and means for supplying another material for deposition to the enclosure interior by coevaporation thereof within the enclosure interior.

17. Apparatus as claimed in claim 16, wherein the said operating voltage provided between the anode electrode and at least one of the two cathode electrodes establishing the plasma containing zone is such as to produce a current density in the range of about 10 to 500 microamperes per cm.sq.

18. Apparatus as claimed in claim 16, wherein the gas inlet and the gas outlet are disposed to produce flow of the precursor gas from the anode electrode toward the said at least one electrode that constitutes a substrate or has a substrate attachable thereto to facilitate movement of radicals produced by the glow or plasma discharge toward the respective substrate.

19. Apparatus as claimed in claim 16, and including a plasma-containing shield wall within the said enclosure extending between the two cathode electrodes that establish the plasma-containing zone and surrounding the anode electrode to receive deposited material and inhibit its deposition on the interior wall of the said enclosure.

20. Apparatus as claimed in claim 16, and including in the enclosure a movable shutter, the apparatus also including means for moving the shutter between a position in which it is interposed between the anode and a respective substrate to intercept radicals and provide selective access of the radicals to that substrate, and a position in which it is not so interposed and the radicals have free access to the substrate.

21. Apparatus for the plasma etching, substrate cleaning or deposition of materials on a substrate by D.C. glow or plasma discharge comprising:

an enclosure having a gas inlet to its interior and a gas outlet therefrom;

the enclosure having in its interior at least one cathode electrode constituting the said substrate or having the substrate attachable thereto and at least one other cathode electrode, the enclosure having therein two spaced cathode electrodes establishing a plasma containing zone between them with an intermediate anode electrode disposed in the said plasma-containing zone between the two cathode electrodes establishing the plasma containing zone, the anode electrode being permeable to electrons;

means for supplying to the enclosure interior at least one precursor gas ionizable by the D.C. glow or plasma discharge to provide radicals of material that will perform the said plasma etching, substrate cleaning or material deposition;

the gas inlet being disposed to deliver the precursor gas into the enclosure interior at least adjacent to the anode electrode and the gas inlet and the gas outlet being disposed relative to one another to produce flow of the precursor gas from the anode electrode toward the said at least one electrode that constitutes a substrate or has a substrate attachable thereto to facilitate movement of radicals produced by the glow or plasma discharge toward the respective substrate; and means for providing between the two cathode electrodes establishing the plasma containing zone and the anode electrodes respective operating D.C. voltages such as to establish between them a saddle configuration electric field of strength sufficient to produce the ionization of the precursor gas, the saddle configuration field attracting electrons toward both sides of the anode electrode which because of its permeability permits electrons to pass therethrough, whereby electrons oscillate back and forth through the anode electrode and produce ionization of the precursor gas and generation at least in the immediate vicinity of the anode electrode of corresponding glow or plasma discharge that is a source of radicals moving to the substrate to perform the said plasma etching, substrate cleaning or material disposition.

22. Apparatus as claimed in claim 21, wherein the said operating voltage provided between the anode electrode and at least one of the two cathode electrodes establishing the plasma containing zone is such as to produce a current density in the range of about 10 to 500 microamperes per cm.sq.

23. Apparatus as claimed in claim 21, and including a plasma-containing shield wall within the said enclosure extending between the two cathode electrodes that establish the plasma-containing zone and surrounding the anode electrode to receive deposited material and inhibit its deposition on the interior wall of the said enclosure.

24. Apparatus as claimed in claim 21, and including in the enclosure a movable shutter, the apparatus also including means for moving the shutter between a position in which it is interposed between the anode and a respective substrate to intercept radicals and provide selective access of the radicals to that substrate, and a position in which it is not so interposed and the radicals have free access to the substrate.

* * * * *